(12) United States Patent
Hoffmann

(10) Patent No.: US 10,908,216 B2
(45) Date of Patent: Feb. 2, 2021

(54) DEVICE FOR MEASURING A CONDITION OF AN ELECTRIC SWITCH, ELECTRIC SWITCH AND METHOD FOR MEASURING A CONDITION OF AN ELECTRIC SWITCH

(71) Applicant: EPCOS AG, Munich (DE)

(72) Inventor: Robert Hoffmann, Berlin (DE)

(73) Assignee: EPCOS AG, Munich (DE)

( * ) Notice: Subject to any disclaimer, the term of this patent is extended or adjusted under 35 U.S.C. 154(b) by 144 days.

(21) Appl. No.: 16/088,023

(22) PCT Filed: Feb. 23, 2017

(86) PCT No.: PCT/EP2017/054171
§ 371 (c)(1),
(2) Date: Sep. 24, 2018

(87) PCT Pub. No.: WO2017/162396
PCT Pub. Date: Sep. 28, 2017

(65) Prior Publication Data
US 2019/0170824 A1    Jun. 6, 2019

(30) Foreign Application Priority Data
Mar. 24, 2016 (DE) ......................... 10 2016 105 544

(51) Int. Cl.
*G01R 31/327* (2006.01)
*H01H 9/16* (2006.01)
(Continued)

(52) U.S. Cl.
CPC .......... *G01R 31/3278* (2013.01); *H01H 9/16* (2013.01); *H01H 33/025* (2013.01); *H01H 47/002* (2013.01); *H01H 71/04* (2013.01)

(58) Field of Classification Search
CPC .. G01R 31/00; G01R 31/327; G01R 31/3274; G01R 31/3277; G01R 31/3278;
(Continued)

(56) References Cited

U.S. PATENT DOCUMENTS 4,969,063 A * 11/1990 Scott ...................... H01H 71/04
200/310
6,111,212 A * 8/2000 DuPont ................. H01H 33/75
218/154
(Continued)

FOREIGN PATENT DOCUMENTS

DE        10158316 A1    6/2003
DE    102012008601 A1    10/2013
(Continued)

OTHER PUBLICATIONS

"GIGAVAC HX22 300+ Amp 1500 Vdc Contactor," Advanced Switching Solutions, Revision 4, Catalog EV200-R-TBD, Revised Aug. 2007, May 9, 2014, 4 pages.
(Continued)

*Primary Examiner* — Hoai-An D. Nguyen
(74) *Attorney, Agent, or Firm* — Slater Matsil, LLP

(57) ABSTRACT

A device for measuring a condition of an electric switch, an electric switch and a method for measuring a condition of an electric switch are disclosed. In an embodiment an apparatus for measuring a state of an electrical switch is configured to tap a voltage at main contacts of the electrical switch.

15 Claims, 3 Drawing Sheets

(51) Int. Cl.
  *H01H 71/04* (2006.01)
  *H01H 33/02* (2006.01)
  *H01H 47/00* (2006.01)
(58) Field of Classification Search
  CPC .......... G01R 31/333; H01H 9/00; H01H 9/16;
      H01H 33/00; H01H 33/02; H01H 33/025;
      H01H 47/00; H01H 47/002; H01H 71/00;
      H01H 71/04; H01H 1/00; H01H 1/0015
  USPC .................................................. 324/415–424
  See application file for complete search history.

(56) References Cited

U.S. PATENT DOCUMENTS

| | | | |
|---|---|---|---|
| 7,224,287 | B2 | 5/2007 | Heider et al. |
| 9,117,609 | B2 | 8/2015 | Kodama |
| 9,218,923 | B2 | 12/2015 | Johansson |
| 9,260,015 | B2 | 2/2016 | Gonzales et al. |
| 9,595,405 | B2 | 3/2017 | Suchalla et al. |
| 2003/0142452 | A1 | 7/2003 | Heider et al. |
| 2006/0138088 | A1* | 6/2006 | Meinherz ............... H02B 5/06 218/119 |
| 2007/0132457 | A1* | 6/2007 | Okamoto ............ G01R 31/396 324/522 |
| 2013/0142452 | A1 | 6/2013 | Shionozaki et al. |
| 2014/0055142 | A1* | 2/2014 | Klapper ............... G01R 31/333 324/421 |
| 2016/0259007 | A1 | 9/2016 | Mair et al. |
| 2016/0349328 | A1* | 12/2016 | Seino .................... H01H 9/167 |
| 2017/0069450 | A1 | 3/2017 | Bimer et al. |

FOREIGN PATENT DOCUMENTS

| | | |
|---|---|---|
| DE | 102013110993 A1 | 4/2015 |
| DE | 102014119657 A1 | 7/2015 |
| DE | 102014007459 A1 | 11/2015 |
| EP | 2590199 A1 | 5/2013 |
| EP | 2682971 A | 1/2014 |
| JP | 2003534633 A | 11/2003 |
| JP | 2012199116 A | 10/2012 |
| JP | 2015076231 A | 4/2015 |

OTHER PUBLICATIONS

"KILOVAC EV200 Series Contactor With 1 Form X Contacts Rated 500+ Amps, 12-900VDC," Catalog EV200-R-TBD, www.tycoelectronics.com, Revised Aug. 2007, 2 pages.

* cited by examiner

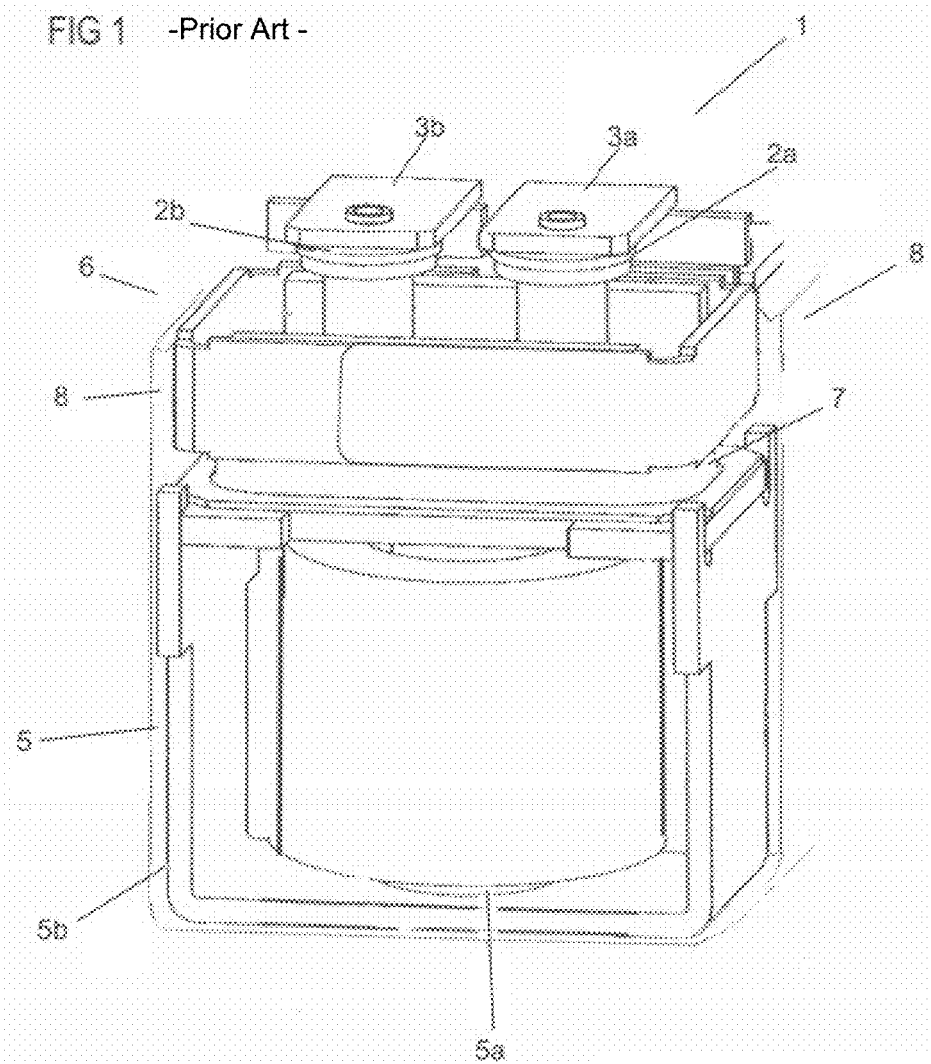

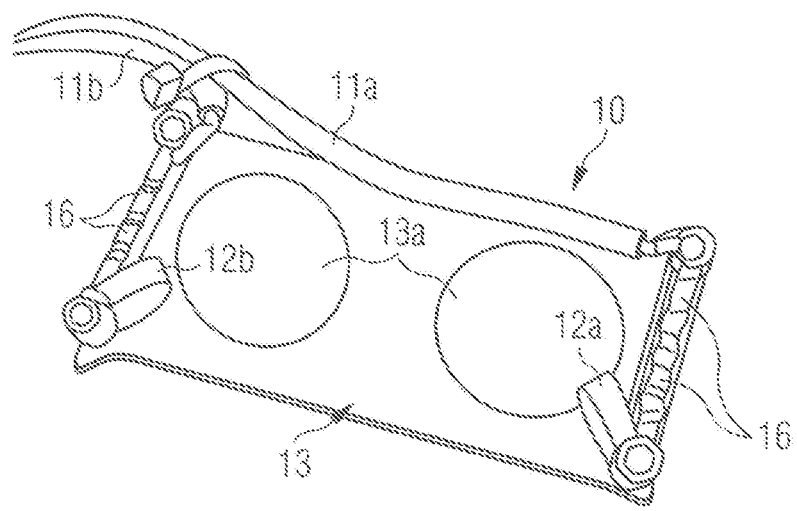
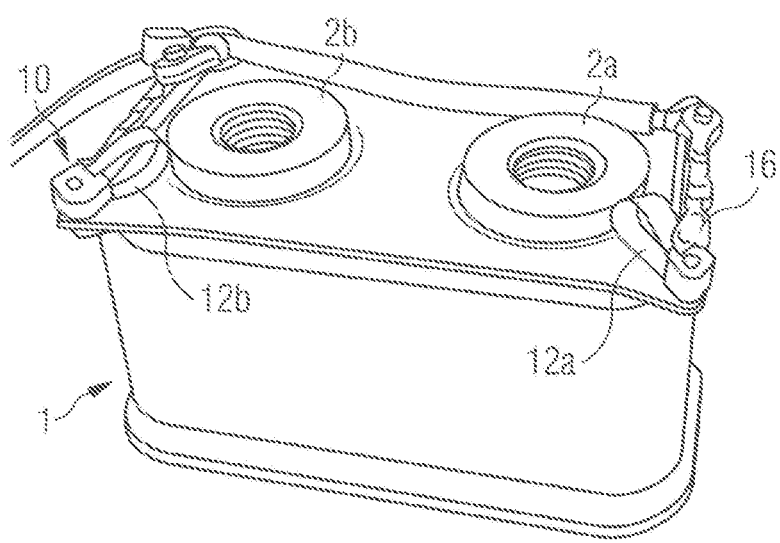

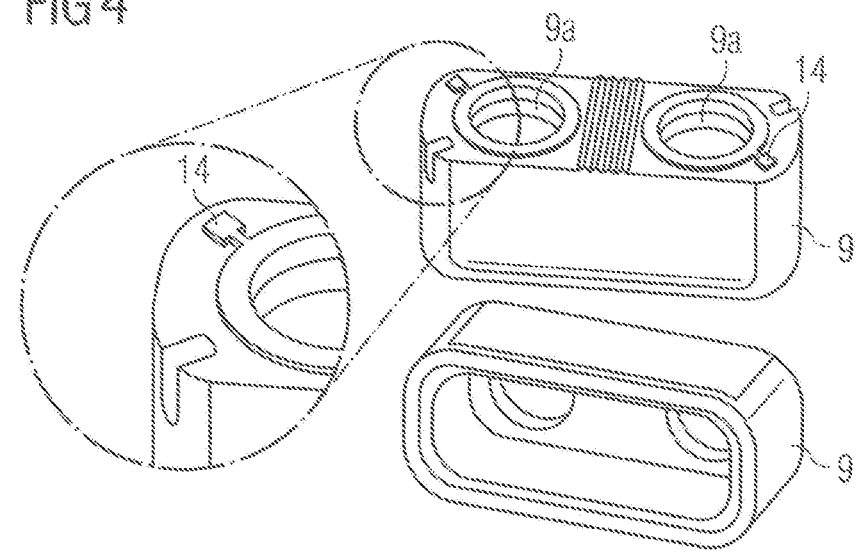
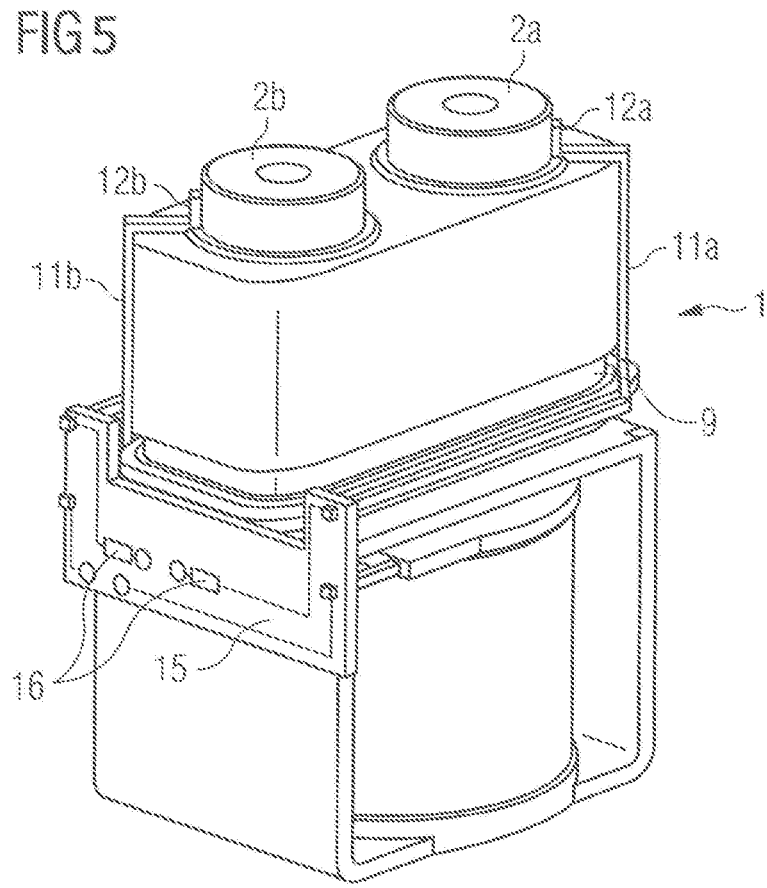

DEVICE FOR MEASURING A CONDITION OF AN ELECTRIC SWITCH, ELECTRIC SWITCH AND METHOD FOR MEASURING A CONDITION OF AN ELECTRIC SWITCH

This patent application is a national phase filing under section 371 of PCT/EP2017/054171, filed Feb. 23, 2017, which claims the priority of German patent application 10 2016 105 544.1, filed Mar. 24, 2016, each of which is incorporated herein by reference in its entirety.

TECHNICAL FIELD

The present invention relates to an apparatus for measuring a state of an electrical switch. The invention further relates to an electrical switch, for example, a power contactor or a relay, and to a method for measuring a state of an electrical switch.

BACKGROUND

Power contactors or relays are electrically operated, remotely actuated switches. They have a control circuit, which can switch a load circuit on and off. One possible application of power contactors is the opening and isolating of battery circuits in motor vehicles (HEV, PHEV, BEV, etc.). In this case, both the positive and the negative contact of the battery are generally isolated with the aid of a power contactor. Said isolation takes place in the rest state of the vehicle and also in the case of a fault, for example, in the case of an accident. In this case, the main task of the power contactor is to deenergize the vehicle and to interrupt the flow of current.

It is important to know the state of the contactor exactly in order to be able to perform replacement in case of doubt. A particularly serious fault case that can occur in the case of a contactor of this kind is what is known as a "stuck" contactor. In this case, the closing element adheres to one or both inner contacts during disconnection or connection due to welding. This means that reliable isolation of the load circuit is not ensured even though the supply voltage of the contactor has been disconnected.

For reasons of safety, identification of the switching position of the contacts of the power contactor/the relay is therefore extremely useful. This makes it possible, for example, in the event of an adhering contact, to react to the abnormal response with suitable measures.

SUMMARY OF THE INVENTION

Embodiments provide an apparatus for improved measurement of a state of an electrical switch, an improved electrical switch, in particular an improved power contactor or an improved relay, and an improved method for measuring a state of an electrical switch. For example, the state of the switch—open or closed—should be ascertained reliably and without the aid of the supply voltage.

According to one aspect, an apparatus for measuring or ascertaining a state of an electrical switch is specified. It is intended for the state of the switch to be monitored by the apparatus. The electrical switch is, in particular, a power contactor or a relay.

The apparatus may be configured and arranged to tap a voltage at main contacts of the electrical switch. It is intended for the voltage to be tapped directly at the main contacts. The apparatus is configured to be at least partly integrated into the switch. In this way, conclusions can be made directly about the state of the switch (open or closed). The state of the switch can be ascertained without the aid of the supply voltage. In addition, a loss of insulation performance (for example, due to vapor deposition on the inner wall of the switch or due to external influences) can also be detected. The state of the switch can thus be ascertained in an effective and reliable manner with the aid of the apparatus.

According to one exemplary embodiment, the apparatus has a first HV line. The apparatus has a first contact. The first contact is arranged on the first HV line. The apparatus has a second HV line. The apparatus has a second contact. The second contact is arranged on the second HV line.

The apparatus may have at least one high-impedance resistor. The at least one high-impedance resistor is configured and arranged to interrupt the flow of current on any desired HV line, that is to say the first HV line or the second HV line.

The apparatus preferably has at least one first high-impedance resistor and at least one second high-impedance resistor. The apparatus preferably has four high-impedance resistors. The flow of current on the HV lines is preferably interrupted by the resistors.

The respective resistor preferably has a value that permits a maximum flow of current of 1 mA in the case of an external short-circuit of the two HV lines. The respective resistor has a value of greater than or equal to 1 Mohm, for example, R is >>1 Mohm. The state of the switch can be monitored in a cost-effective and simple manner due to the simple design of the apparatus.

According to one exemplary embodiment, the first contact is provided to be connected directly to a first main contact of the switch. The second contact is provided to be connected directly to a second main contact of the switch. The contacts can be provided to be connected in a releasable or nonreleasable manner to the main contacts. Auxiliary contacts for measuring the state of the switch are superfluous. A particularly simple and effective apparatus is thus provided.

According to one exemplary embodiment, the apparatus has a carrier. The carrier can comprise a thermoplastic. The carrier is provided and configured to be arranged on the switch, preferably inside a housing of the switch. The first and the second contact and the respective resistor are arranged on the carrier. Furthermore, a part of the HV lines can also be arranged on the carrier. The apparatus can be arranged on the switch in a simple manner with the aid of the carrier. The carrier also makes it possible to provide a simple and reliable connection between the contacts of the apparatus and the main contacts of the switch.

According to one exemplary embodiment, the contacts are configured to be soldered to the main contacts. A particularly reliable connection between the contacts of the apparatus and the main contacts is thus made possible.

According to one aspect, an electrical switch, for example, a power contactor or a relay, is described. The switch has the apparatus described above. The apparatus is at least partly integrated into the switch. The apparatus has at least one high-impedance resistor, preferably two or four high-impedance resistors.

The switch may have a first outer main contact and a second outer main contact. The switch may include a housing. The main contacts may project at least partly out of a top side of the housing.

The first contact and the second contact can each be connected directly to a main contact. The contacts are electrically and mechanically connected directly to the main contacts. The direct tapping of the voltage at the main contacts makes it possible to evaluate the state of the switch directly. Further components, such as auxiliary contacts, for example, are superfluous.

The contacts can be connected in a releasable or nonreleasable manner to the main contacts. The respective main contact is preferably connected on an outer side to the respective contact. In this way, the shortening of an insulation clearance between the main contacts is avoided. The voltage at the main contacts is tapped inside the housing of the electrical switch. In particular, the apparatus is at least partly arranged inside the housing. This relates to the contacts, the resistors and a subregion of the HV lines. The arrangement of the current-limiting resistors inside the housing increases the safety during handling.

According to one exemplary embodiment, two resistors are provided for each main contact. The resistors have a value of at least 1 Mohm. The resistors have, for example, a value of R>>1 Mohm. The resistors are configured and arranged to interrupt the flow of current on the HV lines. An unintentional short-circuit also has no effects due to the high resistances.

According to one exemplary embodiment, the first contact and the second contact are sliding contacts. This makes it possible to form a releasable connection between the contacts and the main contacts. This is advantageous, in particular, when wearing parts of the switch have to be replaced or repaired and the connection between the apparatus and the main contacts has to be released for this.

According to one exemplary embodiment, the first contact and the second contact are fixedly and, in particular, non-releasably connected to the respective main contact. For example, the first contact and the second contact are welded or soldered to the respective main contact. A particularly stable connection between the apparatus and the switch can thus be provided.

According to one aspect, a method for measuring a state of an electrical switch is described. The switch preferably corresponds to the switch described above. All of the features that have been described in relation to the switch also apply to the method and vice versa.

The method has the following steps: providing an electrical switch, for example, a power contactor or a relay. The switch has a first outer main contact and a second outer main contact. The switch is preferably initially provided without a housing. For example, the housing is at least partly dismantled in one method step—; providing an apparatus for tapping a voltage at the main contacts. The apparatus preferably corresponds to the apparatus described above. All of the features that have been described in relation to the apparatus also apply to the method and vice versa. The apparatus has, in particular, a first and second contact, at least one high-impedance resistor, preferably at least two high-impedance resistors, and a first and second HV line-; directly electrically and mechanically connecting the first contact to the first main contact and directly electrically and mechanically connecting the second contact to the second main contact. For example, the contacts are soldered to the main contacts or welded thereon. As an alternative thereto, said contacts could also be configured as sliding contacts. The connection between the contact and the main contact is preferably effected on outer sides of the main contact-; and linking the HV lines to an A/D converter for the direct measurement and evaluation of the voltage at the main contacts.

The voltage can be measured directly at the main contacts in a simple and effective manner by the method. The state of the switch can thus be measured exactly. In this case, the extinguishing capacity of the switch and thus the performance of said switch are not influenced. The electrical insulation clearance is also not influenced.

According to one exemplary embodiment, the apparatus has a carrier. The carrier is placed onto the switch, in particular a top side of the switch. The carrier makes it possible to provide a direct, preferably releasable, connection between the first and second contact and the respective main contact.

According to one exemplary embodiment, the switch has a housing. The apparatus is at least partly arranged inside the housing. For this purpose, the housing is removed in a preceding step in order to fit the apparatus. The housing is then refitted. The safety is increased by fitting the apparatus inside the housing.

According to one aspect, the use of an apparatus for measuring a state of an electrical switch is described. The apparatus described above is preferably used for this. All of the features that have been described in relation to the apparatus also apply to the use and vice versa. It is intended for the state of the switch described above to be measured by the apparatus. In particular, the apparatus serves as an integrated voltage sensor for directly tapping the voltage at the main contacts. The state of the switch can thus be ascertained in an effective and reliable manner.

BRIEF DESCRIPTION OF THE DRAWINGS

The drawings described below are not to be understood as true to scale. Instead, individual dimensions may be illustrated in increased, decreased or else distorted form for the purpose of better illustration.

Elements that are identical to one another or that perform the same function are designated by identical reference signs.

In the drawings:

FIG. 1 shows a sectional illustration of an electrical switch according to the prior art;

FIG. 2 shows an apparatus for measuring a state of an electrical switch according to a first exemplary embodiment;

FIG. 3 shows an electrical switch comprising the apparatus according to FIG. 2;

FIG. 4 shows a subregion of an electrical switch; and

FIG. 5 shows an electrical switch comprising an apparatus for measuring a state of the electrical switch according to a further exemplary embodiment.

DETAILED DESCRIPTION OF ILLUSTRATIVE EMBODIMENTS

FIG. 1 shows an electrical switch according to the prior art. The electrical switch is configured, for example, as a power contactor 1 or as a relay.

The electrical switch 1 has a housing 8 (the housing 8 is illustrated only in subregions in FIG. 1 for the sake of better clarity). A drive unit 5 and a contact apparatus 6 are arranged in the housing 8. The drive unit 5 has, for example, a magnetic drive comprising at least one coil 5a and a plunger 5b, which is arranged in the at least one coil 5a. The coil 5a can be supplied with a voltage from outside in order to generate a magnetic field in the plunger 5b, as a result of which the plunger 5b can be moved axially along its longitudinal axis in the direction of the contact apparatus 6.

The electrical switch 1—in particular the contact apparatus 6—has a first connection element 3a, a second connection element 3b, a first outer main contact 2a, a second outer main contact 2b and a closing element 7 (movable contact bridge 7). The drive unit 5 is arranged and configured to switch the contact bridge 7 over between a first position, in which the contact bridge 7 conductively connects the first outer main contact 2a and the second outer main contact 2b by means of a first and a second inner contact (not explicitly illustrated), and a second position, in which the first outer main contact 2a and the second outer main contact 2b are insulated.

In order to ascertain the state—open or closed—of the electrical switch 1, a mechanical auxiliary contact, for example, an auxiliary contact bridge, which is arranged in parallel with the closing element 7 (contact bridge 7), is generally used to infer the state of the main contacts 2a, 2b (not explicitly illustrated). In particular, an auxiliary contact bridge in the form of a plastic bridge is guided in parallel with the closing element 7. The auxiliary contact bridge actuates a microswitch or a button, the signal of which then signals "open" or "closed".

Depending on the selection of the microswitch, a signal "normally open", "normally closed" or a changeover contact can be realized. A disadvantage of this arrangement is that microswitches have a very limited lifetime. In addition, the switch is located in an environment in which it can become very warm, which also accelerates failures. In electrical switches of this kind, extinguishing magnets are generally fitted around the contacts, which extinguishing magnets promote are extinguishing. When fitting said microswitch, one of said magnets is omitted for reasons of space, which results in a reduced performance of the electrical switch (arc extinguishing capability).

Also known is the closure of a low-wear switch in the form of two metal sheets lying one above the other (auxiliary contacts; not explicitly illustrated). Said metal sheets can then be evaluated externally in a very simple manner. In particular, the auxiliary contact is closed when the contact bridge 7 is in the upper position. A disadvantage of this construction is that the auxiliary contacts are mounted very close to the main contacts 2a, 2b. In this case, electrical flashovers from the load circuit onto the evaluation unit of the control circuit can occur (reduction of the electrical insulation clearance).

A great disadvantage of the aforementioned solutions is that it is not the state of the main contact itself that is evaluated, but that of an auxiliary contact. The situation of a single-side stuck contactor is conceivable, in which the main contact hangs between the upper and the lower bearing position. In this case, the auxiliary contact indicates either open or closed (depending on the height). If the bridge holder should be released through disconnection in a particularly severe fault case, "open" could also be signaled even though the bridge adheres to the contacts.

In order to circumvent the above-described disadvantages of the solutions known from the prior art for identifying the switching position of an electrical switch, an apparatus for measuring a state of an electrical switch is described in the following text.

FIG. 2 shows in this case an apparatus 10 for measuring a state of an electrical switch 1 according to a first exemplary embodiment. FIG. 3 shows the electrical switch 1 comprising the apparatus 10 from FIG. 2.

The apparatus 10 is configured to tap a voltage directly at the main contacts 2a, 2b of the electrical switch 1. In this case, the apparatus 10 is electrically conductively connected directly to the main contacts 2a, 2b. The apparatus 10 is provided to be arranged at least partly inside the switch 1, in particular inside the housing 8. The apparatus 10 is an apparatus that is at least partly integrated into the switch 1. The apparatus 10 constitutes an integrated voltage sensor.

The apparatus 10 has a first contact 12a and a second contact 12b. The contacts 12a, 12b are configured and arranged to be connected directly to the main contacts 2a, 2b of the switch 1 in order to measure the voltage applied to the main contacts 2a, 2b. In this exemplary embodiment, the contacts 12a, 12b are sliding contacts. In other words, the contacts 12a, 12b are not connected fixedly or nonreleasably to the main contacts 2a, 2b. In this context, nonreleasable means that a connection cannot be released without at least one of the component parts involved in the connection being destroyed in the process.

The apparatus 10 also has a first HV line 11a and a second HV line 11b. The first HV line 11a, in particular a first end of the first HV line 11a, is electrically connected to the first contact 12a. The first contact 12a is arranged at the first end of the first HV line 11a. The second HV line 11b, in particular a first end of the second HV line 11b, is electrically connected to the second contact 12b. The second contact 12b is arranged at the first end of the second HV line 11b. A second end of the first HV line 11a and the second HV line 11b is connected, for example, to an A/D converter (not explicitly illustrated).

The apparatus 10 has at least two high-impedance resistors 16. In this exemplary embodiment, four high-impedance resistors 16 are provided: two resistors 16 for each main contact 2a, 2b. The resistors have a value of at least 1 Mohm. Greater values are also conceivable. The value of the resistors can also be >>1 Mohm.

The flow of current on the HV lines 11a, 11b is practically interrupted by suitable high-impedance resistors 16. At operating voltages of up to a maximum of 1000 V, only currents <<1 mA can arise. An unintentional short-circuit also has no effects due to the high resistances.

The apparatus 10 also has a carrier 13. The carrier 13 preferably comprises a thermoplastic. For example, the carrier 13 comprises polytetrafluoroethylene (Teflon). The contacts 12a, 12b, the resistors 16 and subregions of the HV lines 11a, 11b are arranged, for example, screwed, on the carrier 13. The carrier 13 is configured to be placed onto the electrical switch 1, for example, a power contactor. The carrier 13 has recesses 13a. In particular, the carrier 13 has two recesses 13a. The recesses 13a are of circular design. The recesses 13a are provided to receive the main contacts 2a, 2b in the recesses 13a. A diameter of the respective recess 13a is in this case larger than a diameter of the respective main contact 2a, 2b.

FIG. 3 illustrates the apparatus 10 arranged on the electrical switch 1. The apparatus 10, in particular the carrier 13 comprising the contacts 12a, 12b and the resistors 16, is arranged in this case at a top side of the switch 1. The carrier 13 is placed on the top side. A base area of the carrier 13 is greater than a base area of the contact apparatus 6 or a top subregion of the switch 1. The carrier 13 thus projects beyond the top side of the switch 1 in the radial direction.

The main contacts 2a, 2b are mounted in the recesses 13a of the carrier 13 and project out of the recesses 13a. The carrier 13 is arranged inside the housing 8 of the switch 1 (not explicitly illustrated). The apparatus 10 thus constitutes a voltage sensor that is integrated into the switch 1.

The contacts 12a, 12b are connected directly to the main contacts 2a, 2b so that the voltage at the main contacts 2a, 2b can be tapped directly. The voltage is tapped at outer sides of the main contacts 2a, 2b in order that the insulation clearance between the main contacts 2a, 2b is not shortened. Since the voltage at the main contacts 2a, 2b can be evaluated directly, conclusions about the state of the switch 1 can be made directly (open or closed). In addition, a loss of insulation performance (for example, due to vapor deposition on the inner wall of the switch 1 or due to external influences) can be detected. The HV lines 11a, 11b are guided out of the housing 8 of the switch 1 at a common point in order to be connected to the A/D converter.

FIG. 4 shows a subregion, in particular a top subregion, of an electrical switch 1. FIG. 5 also shows an electrical switch 1 comprising an apparatus 10 for measuring a state of the electrical switch 1 according to a further exemplary embodiment.

The subregion illustrated in FIG. 4 is, for example, an inner housing part 9 of the switch 1. The inner housing part 9 preferably comprises a ceramic. The inner housing part 9 is configured to receive the contact apparatus 6. The inner housing part 9 has two recesses 9a. The recesses 9a are of circular design and are dimensioned to receive the main contacts 2a, 2b. The main contacts 2a, 2b are guided through the recesses 9a (see FIG. 5).

The inner housing part 9 has solder connections 14. In particular, each solder connection 14 is formed adjacent to a recess 9a. The solder connections are integrated directly into the inner housing part 9 or into the ceramic of the inner housing part 9.

The respective solder connection 14 is configured and dimensioned to electrically conductively connect, in particular to solder, the contacts 12a, 12b of the apparatus 10 directly to the main contacts 2a, 2b. The respective solder connection 14 consequently constitutes a region in which the contacts 12a, 12b are soldered to the main contacts 2a, 2b. Through the direct solder connection between the contacts 12a, 12b and the main contacts 2a, 2b, a carrier 13 as illustrated in FIGS. 2 and 3 can be omitted completely (see FIG. 5).

In FIG. 5, the apparatus 10 is fitted onto the switch 1. The contacts 12a, 12b are fixedly connected, in particular soldered, directly to the main contacts 2a, 2b by means of the solder connections 14. The contacts 12a, 12b are arranged on outer sides of the main contacts 2a, 2b. The voltage is tapped at the outer sides of the main contacts 2a, 2b in order that the insulation clearance between the main contacts 2a, 2b is not shortened.

The HV lines 11a, 11b are guided along the housing part 9 in the vertical direction. The HV lines 11a, 11b are guided along the housing part 9 in the horizontal direction at a bottom end of the inner housing part 9. The HV lines 11a, 11b are joined at a printed circuit board 15. The printed circuit board 15 is arranged inside the housing 8 of the switch 1 at an end face of the switch 1. In other words, the printed circuit board 15 is secured to an end-side inner face of the switch 1.

The resistors 16 described above are formed on the printed circuit board 15. The resistors 16 are consequently arranged inside the housing 8. The fitting of the current-limiting resistors 16 inside the housing 8 increases the safety during handling. Fitting the resistors 16 close to the A/D converter is, in particular, not possible since the HV lines 11a, 11b otherwise carry not only the potential from the switch 1 as far as there but also the full short-circuit power of the battery. Regions of the HV lines 11a, 11b that are guided away again from the printed circuit board 15 are guided out of the housing 8 at a predetermined point (not explicitly illustrated) and subsequently connected to the A/D converter.

The apparatuses 10 for measuring the state of an electrical switch 1 that are described in connection with FIGS. 2 to 5 have the advantage that i) direct tapping of the voltage at the main contacts 2a, 2b and hence direct evaluation are made possible. In particular, auxiliary contacts and evaluation of the state of the auxiliary contacts are not necessary;

ii) the apparatus is very low-wear since no movable elements are provided;

iii) the apparatus does not influence the extinguishing capability of the switch 1. Space-related omission of extinguishing magnets is not necessary;

iv) the apparatus does not influence the electrical insulation clearance;

v) the option for more exact evaluation (not just 1 or 0 for open or closed) but also detection of leakage currents due to decreasing insulation resistance in the open state is provided.

In the following text, a method for measuring a state of an electrical switch 1 is described. The electrical switch 1 is preferably configured as a power contactor or as a relay. The electrical switch 1 corresponds, for example, to the switch 1 described in connection with FIG. 1.

In a first step, the electrical switch 1 is provided. The switch 1 has a first outer main contact 2a and a second outer main contact 2b. The switch 1 has a housing 8. The housing 8 is provided to receive the components of the switch 1, in particular a drive unit 5 and a contact apparatus 6. If the drive unit 5 and the contact apparatus 6 are arranged in the housing 8, the main contacts 2a, 2b project at least partly out of the housing 8. The switch 1 is initially provided without the housing 8 to perform the further steps of the method.

In a further step, an apparatus 10 is provided to tap a voltage at the main contacts 2a, 2b. The apparatus 10 preferably corresponds to one of the apparatuses described in connection with FIGS. 2 to 5. The apparatus has a first and second contact 12a, 12b, four high-impedance resistors 16 and a first and second HV line 11a, 11b. In the exemplary embodiment according to FIGS. 2 and 3, the apparatus also has a carrier 13. As an alternative thereto, the apparatus can also be configured without a carrier 13 (FIGS. 4 and 5).

In a further step, the first contact 12a is connected directly to the first main contact 2a. The second contact 12b is also connected directly to the second main contact 2b.

This is done either by placing the carrier 13 onto the electrical switch 1 and forming a sliding contact between the contacts 12a, 12b and the main contacts 2a, 2b (see FIGS. 2 and 3).

As an alternative thereto, the contacts 12a, 12b can also be soldered to the main contacts 2a, 2b (FIGS. 4 and 5). In this case, in a preceding step, solder connections 14 are provided on an inner housing part 9 of the switch 1. The HV lines 11a, 11b are then guided along the inner housing part 9 of the switch 1 to a printed circuit board 15. After the housing 8 has been fitted to the switch 1, the HV lines 11a, 11b are guided from the printed circuit board 15 out of the housing 8.

In a further step, the housing 8 is provided and arranged above the components described above. According to the exemplary embodiment described in FIGS. 2 and 3, the HV lines 11a, 11b are guided out of the housing 8 at a common point at a top side of the switch 1. A corresponding recess is provided on the housing 8.

According to the exemplary embodiment described in FIGS. 4 and 5, the HV lines 11a, 11b, proceeding, for example, from an end side of the switch 1, are guided out of the housing 8 from the printed circuit board 15. A corresponding recess is provided on the housing 8.

In a further step, the HV lines 11a, 11b are linked to an A/D converter.

Owing to the method described above, it is possible to tap the voltage at the main contacts 2a, 2b directly and hence to evaluate said voltage directly. The state of the switch 1 can thus be ascertained in a reliable and effective manner. The performance of the electrical switch 1 is not adversely affected. Furthermore, it is also possible to detect leakage currents in the open state of the switch 1.

The description of the subjects specified here is not limited to the individual specific embodiments. Rather, the features of the individual embodiments—insofar as it makes technical sense—can be combined with one another arbitrarily.

The invention claimed is:

1. An apparatus for measuring a state of an electrical switch, the apparatus comprising:
a first high voltage (HV) line comprising a first contact, a second HV line comprising a second contact, and at least one high-impedance resistor, wherein the resistor is configured to interrupt a flow of current on one of the HV lines,
wherein the apparatus is located inside a housing of the electrical switch, and
wherein the apparatus is configured to tap a voltage at outer main contacts of the electrical switch located inside the housing.

2. The apparatus according to claim 1, wherein the resistor has a value configured to permit a maximum flow of current of 1 mA in case of an external short-circuit of the first and second HV lines.

3. The apparatus according to claim 1, wherein the first contact and the second contact are configured to be connected directly to the outer main contacts of the electrical switch.

4. The apparatus according to claim 1, further comprising a carrier, wherein the first contact, the second contact and the resistor are arranged on the carrier.

5. The apparatus according to claim 1, wherein the at least one high-impedance resistor comprises at least one first high-impedance resistor and at least one second high-impedance resistor, wherein the respective resistor is configured to interrupt the flow of current on the respective HV line.

6. An electrical switch comprising:
an apparatus comprising a first high voltage (HV) line comprising a first contact, a second HV line comprising a second contact, and at least two high-impedance resistors;
a first outer main contact;
a second outer main contact; and
a housing,
wherein the first contact is directly connected to the first outer main contact and the second contact is directly connected to the second outer main contact,
wherein the apparatus is integrated into the electrical switch and configured to:
tap a voltage at the first and second outer main contacts inside the housing of the electrical switch, and
measure a state of the electrical switch.

7. The electrical switch according to claim 6, wherein the resistors are arranged inside the housing.

8. The electrical switch according to claim 6, wherein two resistors are provided for each main contact.

9. The electrical switch according to claim 6, wherein the first contact and the second contact are sliding contacts.

10. The electrical switch according to claim 6, wherein the first contact and the second contact are fixedly connected to their respective outer main contact.

11. The electrical switch according to claim 10, wherein the first contact and the second contact are welded or soldered to their respective outer main contact.

12. A method for measuring a state of an electrical switch, the method comprising:
providing the electrical switch having a first outer main contact and a second outer main contact;
providing a housing;
providing an apparatus for tapping a voltage at the first outer main contact and the second outer main contact, wherein the apparatus is integrated into the electrical switch inside the housing, and wherein the apparatus has a first contact, a second contact, at least two high-impedance resistors, a first high voltage (HV) line and a second HV line;
directly connecting the first contact to the first outer main contact;
directly connecting the second contact to the second outer main contact; and
linking the HV lines to an A/D converter.

13. The method according to claim 12, wherein the first and second contacts are welded or soldered to the first and second outer main contacts.

14. The method according to claim 12, wherein the apparatus further comprises a carrier, and wherein the carrier is placed onto the electrical switch for direct connection between the first and second contacts and the first and second outer main contacts.

15. The method according to claim 12, wherein the apparatus is arranged at least partly inside the housing.

* * * * *